(12) United States Patent
Norimatsu

(10) Patent No.: US 6,775,250 B1
(45) Date of Patent: Aug. 10, 2004

(54) METHOD OF UPDATING REFERENCE VALUE IN HIGH SPEED CLOSED LOOP BASED ON LIKELIHOOD

(75) Inventor: Hidehiko Norimatsu, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/561,721

(22) Filed: May 1, 2000

(30) Foreign Application Priority Data

May 6, 1999 (JP) .......................................... 11-126122

(51) Int. Cl.[7] .............................................. G08C 17/00
(52) U.S. Cl. ........................ 370/311; 375/262; 375/344; 455/522; 455/69
(58) Field of Search ................................ 370/310, 311, 370/328, 335, 441; 375/341, 340, 262, 130, 140, 141; 455/571, 522, 69

(56) References Cited

U.S. PATENT DOCUMENTS

| | | | | |
|---|---|---|---|---|
| 4,901,307 A | * | 2/1990 | Gilhousen et al. | 370/320 |
| 5,103,459 A | * | 4/1992 | Gilhousen et al. | 370/206 |
| 5,907,586 A | * | 5/1999 | Katsuragawa et al. | 375/341 |
| 6,070,058 A | * | 5/2000 | Waldroup et al. | 455/69 |
| 6,070,086 A | * | 5/2000 | Dobrica | 455/522 |
| 6,075,974 A | * | 6/2000 | Saints et al. | 455/69 |
| 6,137,840 A | * | 10/2000 | Tiedemann et al. | 375/297 |
| 6,178,194 B1 | * | 1/2001 | Vasic | 375/136 |
| 6,185,431 B1 | * | 2/2001 | Li et al. | 455/522 |
| 6,236,863 B1 | * | 5/2001 | Waldroup et al. | 455/522 |
| 6,240,071 B1 | * | 5/2001 | Willenegger et al. | 370/311 |
| 6,374,085 B1 | * | 4/2002 | Saints et al. | 455/69 |
| 6,414,948 B1 | * | 7/2002 | Sato | 370/335 |

FOREIGN PATENT DOCUMENTS

| | | | |
|---|---|---|---|
| EP | 0683570 | 11/1995 | |
| EP | 0853393 | 7/1998 | |
| GB | 2305827 | 4/1997 | |
| JP | 8-37515 | 2/1996 | |
| JP | 8-181653 | 7/1996 | |
| JP | 10-13325 | 1/1998 | |
| JP | 10-200502 | 7/1998 | |
| JP | 2000324047 A | * 11/2000 | ............ H04B/7/26 |
| WO | WO97/50197 | 12/1997 | |

OTHER PUBLICATIONS

Japenese Office Action issued Feb. 6, 2002 (w/English translation of relevant portion).

* cited by examiner

Primary Examiner—Hassan Kizou
Assistant Examiner—M. McLoughlin
(74) Attorney, Agent, or Firm—Dickstein, Shapiro, Morin & Oshinsky, LLP.

(57) ABSTRACT

A method of updating a reference value in a high speed closed loop based on a likelihood is disclosed. When a path with a smallest accumulated value of Hamming distances from a received sequence is determined as a decoded sequence out of respective paths on a trellis diagram in a Viterbi algorithm, a likelihood which is an accumulated value of Hamming distances between a decoded sequence and a received sequence for a certain period of time is detected. When the likelihood is equal to or lower than a threshold value, update is immediately performed to increase a reference Eb/IO. When the likelihood is higher than the threshold value, an average value of the likelihood for detection over N times is derived. When the average value is lower than L, the reference value is increased. When the average value is higher than M, the reference value is reduced. Otherwise, the reference value is not changed.

3 Claims, 2 Drawing Sheets

METHOD OF UPDATING REFERENCE VALUE IN HIGH SPEED CLOSED LOOP BASED ON LIKELIHOOD

BACKGROUND OF THE INVENTION

1. Field of the Invention

The present invention relates to a closed loop transmission power control method in a CDMA (Code Division Multiple Access) communication system for controlling transmission power of a transmitter such that an Eb/IO value of a signal received at a receiver from each transmitter is equal to a reference value, and more particularly to a method of updating a reference value which serves as a reference in a closed loop transmission power control.

2. Description of the Related Art

In recent years, a CDMA communication method draws attention as a communication method for use in a mobile communication system due to its resistance to interference or disturbance. In the CDMA communication method, for maximizing its communication capacity, it is necessary to adjust transmission power of each of a plurality of transmitters such that input signals from the transmitters have the same level at an antenna end of a receiver. To that end, in a portable phone system of a cellular scheme, for example, a check is made to determine whether the ratio of received signal power to interference power recognized at a receiver in a base station is higher or lower than a preset expected value. Based on the determination result, a signal for requesting an increase or decrease in the transmission power of a mobile station is inserted into a transmitted signal from the base station to the mobile station. The mobile station, upon receiving the signal, controls the transmission power in accordance with the signal inserted into the transmitted signal, thereby achieving control for obtaining a maximum channel capacity. Such control of the transmission power of the mobile station is referred to as high speed closed loop control since it is performed at a relatively high speed.

Typically, since the quality of communication is ultimately determined by a bit error rate (BER), it is essentially preferable that a high speed closed loop is controlled based on the BER. However, the high speed closed loop control requires the loop to converge quickly as mentioned above, while the measurement of the BER usually takes a long time. For this reason, the high speed closed loop control employs a reference which can be quickly recognized instead of the BER. As such a reference, a signal power to interference power ratio (hereinafter referred to as "Eb/IO") is used, for example.

The Eb/IO is usually proportional to the BER. However, the relationship between the Eb/IO and BER may be changed depending on conditions of a communication path, and a minimum level of a required BER may not be ensured even when an Eb/IO value serving as a reference is obtained. To address this problem, outer loop control is used for updating the value of the Eb/IO serving as a reference value. In prior art outer loop control, the BER is measured for a certain period of time and the value of the Eb/IO serving as a reference value is updated in accordance with the obtained BER.

However, the measurement of the BER to $10^{-3}$, for example, takes a minimum of one second at a data speed of approximately 10 k bit/S. The measurement of the BER to $10^{-6}$, in turn, takes as much as 1,000 seconds at the minimum. Additionally, the measurement of the BER requires the use of known data on the reception side and transmission side. However, since typical data is not known, known data used for maintaining synchronization, for example, must be used for the measurement. Such data for maintaining synchronization is redundant information in data communication and usually has a small amount of data transmitted. As a result, the measurement of the aforementioned BER using such known data used for maintaining synchronization takes a significantly long time. Therefore, in the outer loop control which updates a reference value in closed loop transmission power control in accordance with the measured BER, a longer update period of an outer loop prevents a response to a quick change in a communication path, resulting in the possibility of degradation of communication quality.

SUMMARY OF THE INVENTION

It is an object of the present invention to provide a method of updating a reference value in high speed closed loop transmission power control which can respond to a quick change in a communication path.

To achieve the aforementioned object, in the present invention, a path with a smallest accumulated value of distances in codes from a received sequence is first determined as a decoded sequence out of respective paths on a trellis diagram in a Viterbi algorithm. Next, a reference value is updated based on a likelihood which is an accumulated value of distances in codes between a decoded sequence and a received sequence for a certain period of time.

In this manner, the present invention performs update of a reference value in a high speed closed loop based on a likelihood obtained when convolutional-coded signals are decoded with the Viterbi algorithm, thereby making it possible to shorten an update period of a reference value as compared with the update of a reference value based on the BER, and to respond to a quick change in a communication path.

The above and other objects, features and advantages of the present invention will become apparent from the following description with reference to the accompanying drawings which illustrate examples of the present invention.

DETAILED DESCRIPTION OF THE PREFERRED EMBODIMENTS

In digital cellular communication, a transmission signal is generally subjected to error correction coding for correcting transmission errors at a reception side. One of such error correction coding is convolutional coding. As an algorithm for decoding signals which have been subjected to the convolutional coding, the Viterbi algorithm is typically used.

The Viterbi algorithm calculates a likelihood for all paths possibly present in its constraint length, and determines that a path with the highest likelihood is a decoded sequence. Thus, when a decoded sequence is determined, the likelihood of the decoded sequence has been measured already.

When a received sequence includes many errors, a corresponding decoded sequence has a low likelihood. When a received sequence includes a few errors, a corresponding decoded sequence has a high likelihood. In other words, a decoded sequence with a lower likelihood has lower reliability.

In the present embodiment, a reference value is updated in high speed closed loop transmission power control with outer loop control based on the "likelihood" obtained in the Viterbi algorithm. Specifically, an algorithm is employed in which a reference value is increased when the likelihood of a decoded sequence is low, while a reference value is reduced/maintained when the likelihood is high, thereby achieving a reliable determination in a relatively short time without measuring a BER.

Next, description is made for a specific detecting method of a likelihood when the Viterbi algorithm for performing maximum likelihood decoding of convolutional codes is used.

First, a general configuration of a convolutional encoder is described with reference to FIG. 1.

Figure 1:
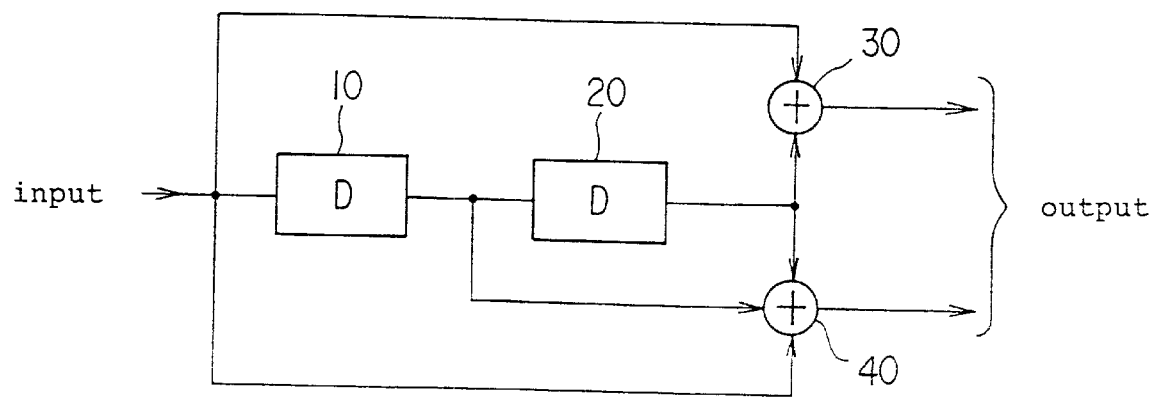
FIG. 1 is a block diagram showing a configuration of a convolutional encoder.

The convolutional encoder comprises registers 10 and 20, adders 30 and 40, as shown in FIG. 1.

Register 10 delays an input signal by one symbol time and then outputs the delayed signal. Register 20 delays the output from register 10 by one symbol time and then outputs it. Adder 30 adds the input signal and the output from register 20 and then outputs the result. Adder 40 adds the output from register 10, the output from register 20, and the input signal and then outputs the result. The outputs from adders 30 and 40 are respectively transmitted to a receiver as output signals which have been subjected to convolutional coding.

Figure 2:
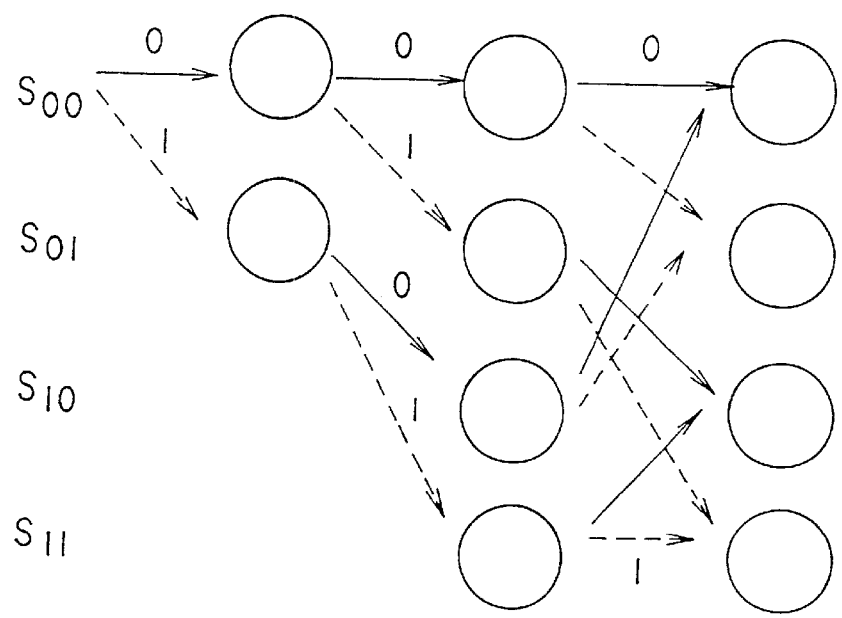
FIG. 2 is a trellis diagram in the Viterbi algorithm.

Next, FIG. 2 shows a trellis diagram in the Viterbi algorithm. In FIG. 2, circles represent the states of registers 10 and 20.

The state of $S_{00}$ represents that both registers 10 and 20 have "0" stored therein. The state of $S_{01}$ represents that register 10 has "1" stored therein and register 20 has "0" stored therein. The state of $S_{10}$ represents that register 10 has "0" stored therein and register 20 has "1" stored therein. The state of $S_{11}$ represents that both registers 10 and 20 have "1" stored therein.

Dotted lines show a state transition for input "1", while solid lines show a state transition for input "0". For example, if input "1" is received in the state of $S_{00}$, the state transitions to $S_{01}$, or if input "0" is received, the state transitions to the state of $S_{00}$.

For example, when attention is focused on $S_{00}$ which is the final state after three transitions beginning with the initial state $S_{00}$, paths for arriving there correspond to input "000" and input "100". On the other hand, when an actual received signal is "111", Hamming distances between the respective paths and the received sequence are 3 and 2, and a likelihood is higher for 2. Thus, the path "000" is discarded. Also, for the final states $S_{01}$, $S_{10}$ and $S_{11}$, operations are repeatedly performed for all the states, and a sequence with the highest likelihood is estimated and determined as a decoded sequence.

Actually, a search for paths in a range up to approximately five times that of a constraint length of the convolutional coding is enough. When a decoded sequence is obtained with this Viterbi algorithm, the likelihood is also obtained as an accumulated value of Hamming distances. This example shows that a smaller number represents a higher likelihood. The Hamming distance is one of various distances in codes for representing distances between codes.

Figure 3:
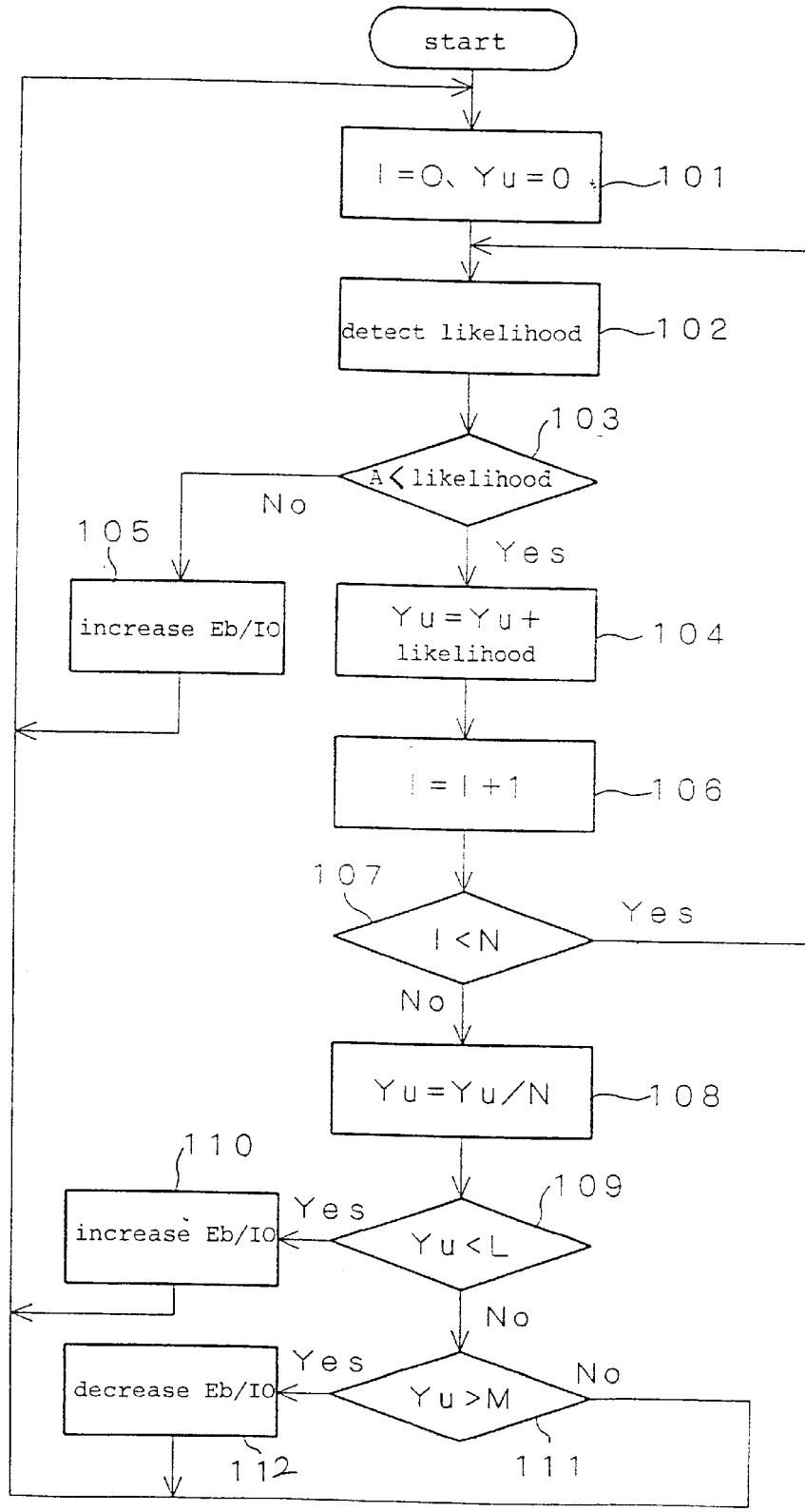
FIG. 3 is a flow chart showing a method of updating a reference value in high speed closed loop transmission power control in an embodiment of the present invention.

FIG. 3 is a flow chart showing an example of an algorithm for updating the value of the Eb/IO serving as a reference value in high speed closed loop control using the likelihood.

First, at step 101, the number of times "I" the likelihood is detected and the accumulated value of the likelihood "Yu" are both set at zero. At step 102, the likelihood is detected in time slots, for example. At step 103, the detected likelihood is compared with a preset threshold value A. When the detected likelihood is determined as being equal to or lower than the threshold value A at step 103, update is immediately performed to increase the Eb/IO serving as a reference value at step 105 since rapid degradation of characteristics in slots is indicated. When the detected likelihood is determined as being higher than the threshold value A at step 103, the value is added to the likelihood so far accumulated at step 104. At step 106, "I" is incremented by one, and at step 107, a check is made to determine whether the value "I" is lower than "N". When the value "I" is determined as being lower than "N" at step 107, the processing from steps 102 to 106 is repeated. "N" is an arbitrarily selected number which is selected in consideration of a tradeoff between a length and accuracy of an update period.

When the value "I" becomes equal to "N", an average value is derived by dividing the accumulated likelihood by "N" at step 108. At steps 109 and 111, a check is made to determine whether the average value is higher or lower than L, M. L and M are threshold values for determining whether update is performed. When the average value is determined as being lower than L at step 109, processing is performed to increase the Eb/IO serving as a reference value at step 110. When the average value is determined as being higher than M at step 111, processing is performed to reduce the Eb/IO serving as a reference value at step 112. Otherwise, the Eb/IO serving as a reference value is not updated and maintained without any change. With the control shown in steps 101 to 112, the Eb/IO serving as a reference value can be set at an appropriate value in accordance with conditions of a communication path.

While the embodiment described above uses a case where the accumulated value for one time slot period in the Hamming distance between a decoded sequence and a received sequence is used as the likelihood, the present invention is not limited thereto, and the present invention can be similarly applied to a case where another accumulated value for a certain period is used as the likelihood.

While a preferred embodiment of the present invention has been described using specific terms, such description is for illustrative purposes only, and it is to be understood that changes and variations may be made without departing from the spirit or scope of the following claims.

What is claimed is:

1. The method of updating a set reference value in high speed closed loop transmission power control in performing a closed loop transmission power control for directing an increase or decrease in transmission power from a receiver to a transmitter such that an Eb/IO value of a signal received by said receiver from said transmitter is equal to said reference value, said method comprising the steps of:

determining as a decoded sequence a path with a smallest accumulated value of distances in codes from a received sequence out of respective paths on a trellis diagram in a Viterbi algorithm; and updating said reference value based on a likelihood which is an accumulated value of distances in codes between said decoded sequence and said received sequence for a certain period of time, wherein said step of updating said reference value based on said likelihood includes the steps of:

increasing said reference value when said likelihood is equal to or lower than a predefined threshold value;

detecting a likelihood only a certain number of times and deriving an average value thereof when said likelihood is higher than said threshold value; and increasing said reference value when said average value is lower than a certain lower limit value, and reducing said reference value when said average value is higher than a certain upper limit value.

2. The method according to claim 1, wherein said certain period of time is one time slot period.

3. The method according to claim 1, wherein said distance in codes is a Hamming distance.

* * * * *